United States Patent [19]
Talreja et al.

[11] Patent Number: 5,317,535
[45] Date of Patent: May 31, 1994

[54] GATE/SOURCE DISTURB PROTECTION FOR SIXTEEN-BIT FLASH EEPROM MEMORY ARRAYS

[75] Inventors: Sanjay S. Talreja, Citrus Heights; Duane Mills, Folsom; Jahanshir J. Javanifard, Sacramento; Sachidanandan Sambandan, Folsom, all of Calif.

[73] Assignee: Intel Corporation, Santa Clara, Calif.

[21] Appl. No.: 901,110

[22] Filed: Jun. 19, 1992

[51] Int. Cl.⁵ .................... G11C 11/34; G11C 7/00; G11C 8/00

[52] U.S. Cl. .................... 365/185; 365/218; 365/230.03; 365/238.5; 365/900

[58] Field of Search ............... 365/185, 230.03, 238.5, 365/218, 900

[56] References Cited

U.S. PATENT DOCUMENTS

| | | | |
|---|---|---|---|
| 4,775,958 | 10/1988 | Hashimoto ..................... | 365/185 |
| 5,033,024 | 7/1991 | O'Connell et al. ......... | 365/230.03 X |
| 5,034,926 | 7/1991 | Taura et al. ................. | 365/185 X |
| 5,065,364 | 11/1991 | Atwood et al. ............... | 365/185 |
| 5,095,461 | 3/1992 | Miyakawa et al. ............ | 365/185 |

*Primary Examiner*—Eugene R. LaRoche
*Assistant Examiner*—Do Hyun Yoo
*Attorney, Agent, or Firm*—Blakely, Sokoloff, Taylor & Zafman

[57] ABSTRACT

In a flash EEPROM memory array in which a plurality of floating gate field effect transistor memory devices are arranged in rows and columns, in which wordlines are utilized to select rows of such devices and bitlines are utilized to select columns of such devices, in which groups of such devices are arranged in blocks which are independently erasable, and the blocks are divided into sub-blocks for storing lower and upper bytes of words to be stored, apparatus is provided for disabling the wordlines to all high byte sub-blocks when a low byte sub-block is to be programmed, for disabling the wordlines to all low byte sub-blocks when a high byte sub-block is to be programmed, for grounding the sources of all high byte sub-blocks when a low byte sub-block is to be programmed, and for grounding the sources of all low byte sub-blocks when a high byte sub-block is to be programmed.

9 Claims, 3 Drawing Sheets

FIG_1 (PRIOR ART)
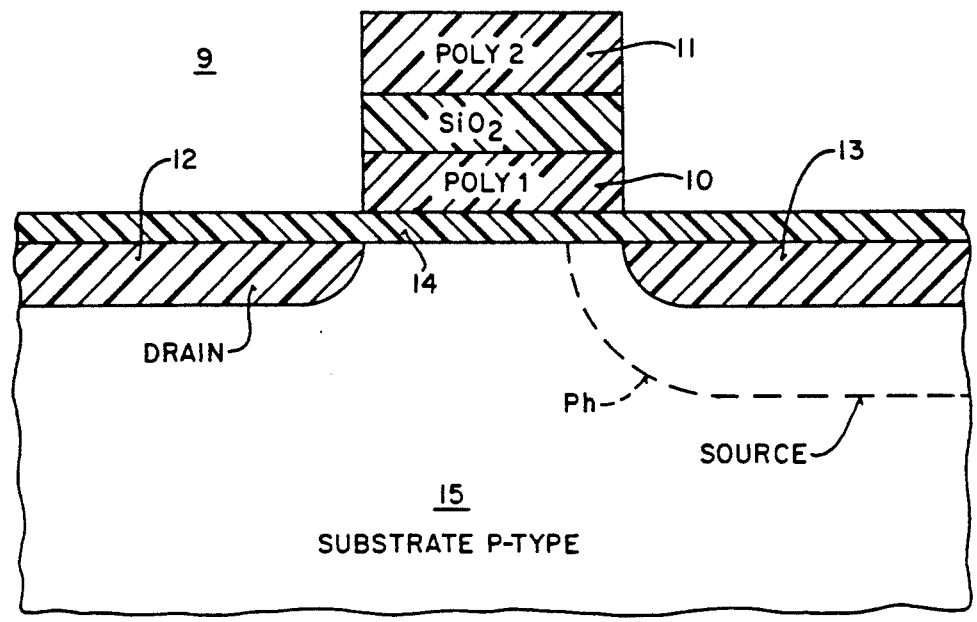
FIG_2
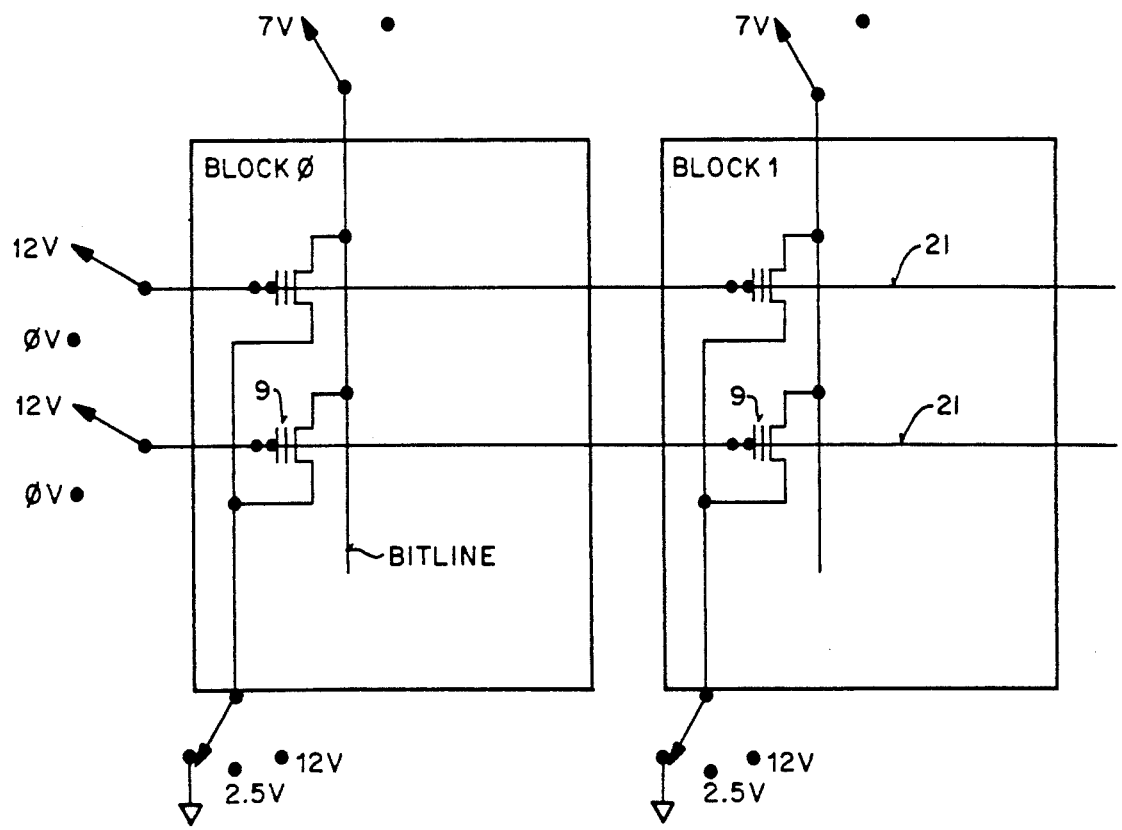

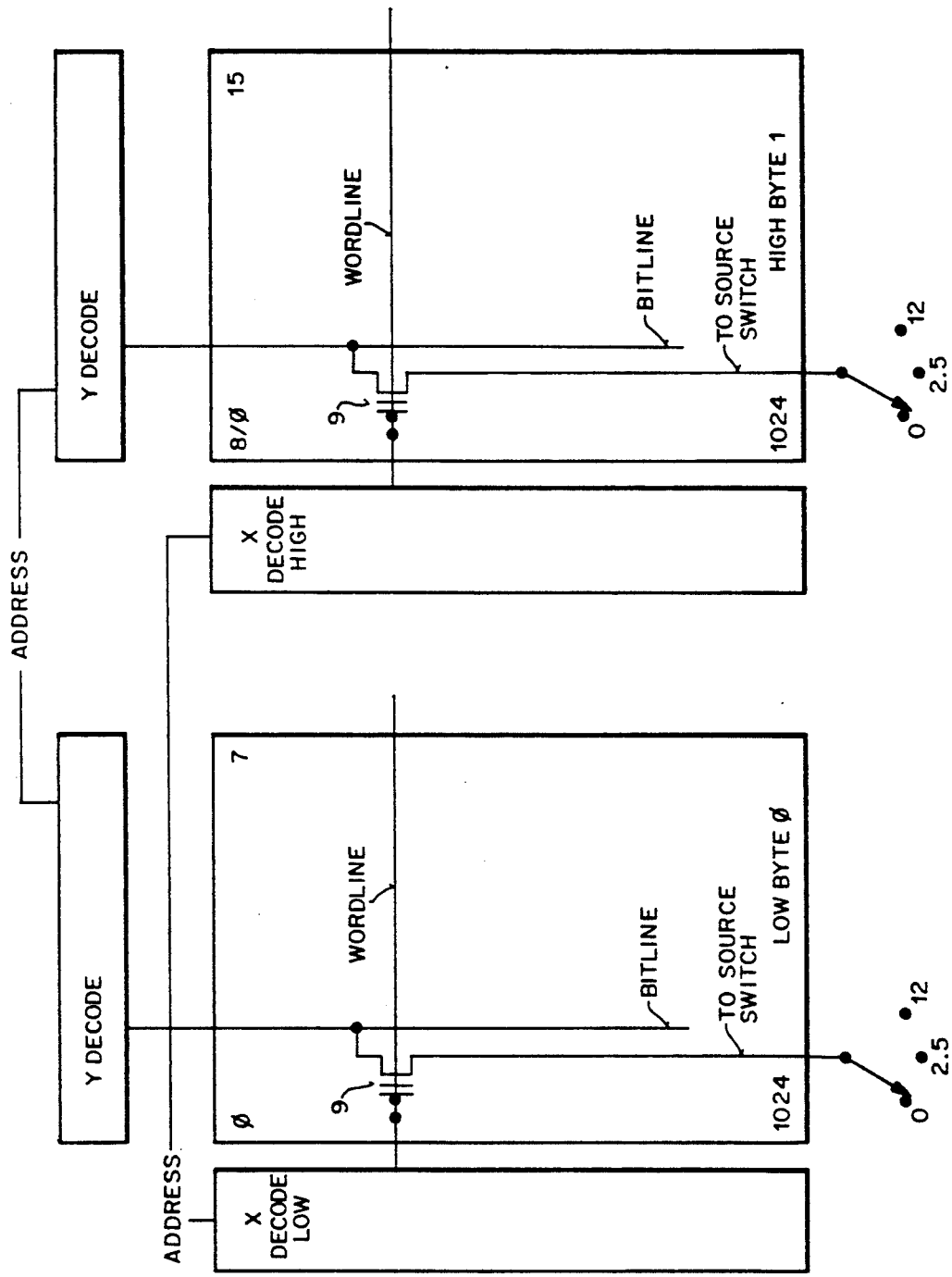

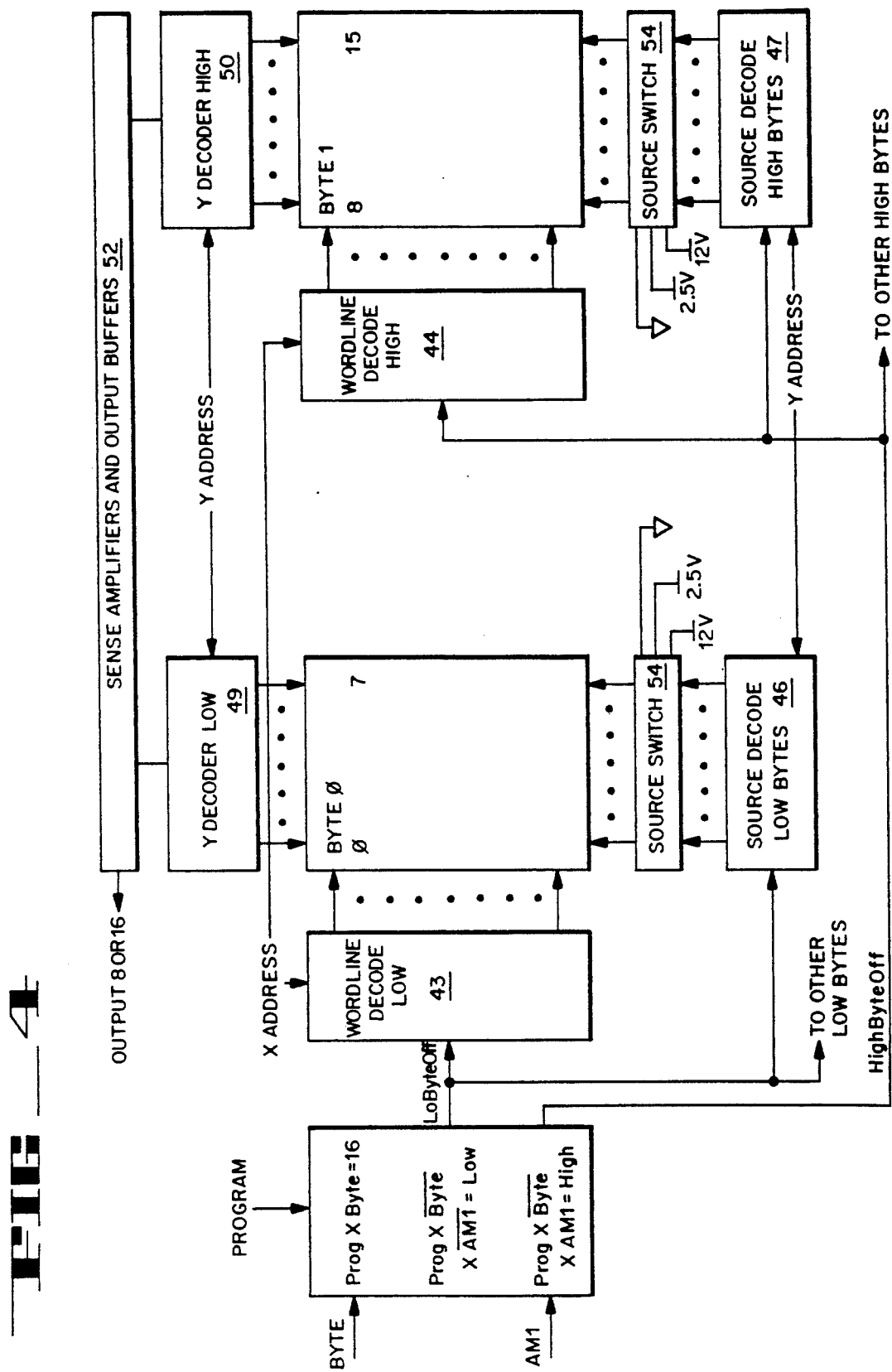
FIG—4

GATE/SOURCE DISTURB PROTECTION FOR SIXTEEN-BIT FLASH EEPROM MEMORY ARRAYS

BACKGROUND OF THE INVENTION

1. Field Of The Invention

This invention relates to flash electrically-erasable programmable read only memory arrays and, more particularly, to circuitry for protecting such arrays from storage errors caused by accessing the array.

2. History Of The Prior Art

Modern computer systems make extensive use of long term memory. One form of long term storage used in computers is flash electrically-erasable programmable read-only memory (flash EEPROM). A flash EEPROM memory array is an EPROM memory array which may be electrically erased and reprogrammed in place. A flash EEPROM memory array includes a large plurality of floating-gate field effect transistors arranged as memory cells in typical row and column fashion with circuitry for accessing the individual cells and placing the memory transistors of those cells in one of two memory conditions. A flash memory cell, like a typical EPROM cell retains information when power is removed from the array.

Flash EEPROM memory has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk drive.

It is well known that when EEPROM cells are used in a memory array, circuitry is sometimes required to electrically isolate the cells one from another. This may be needed, for example, to permit the reading, programming, or erasing of a cell without disturbing the programming of adjacent cells. Examples of such circuitry are illustrated in U.S. Pat. No. 5,065,364, entitled *Apparatus for Providing Block Erasing In A Flash EEPROM*, Atwood et al, issued Nov. 12, 1991, and assigned to the assignee of the present invention.

Prior art memory arrays using flash EEPROM cells which utilize electrical isolation were designed to handle data furnished in eight bit (byte) increments. Flash EEPROM memory arrays, like other forms of long term memory, must read and write data which a host may desire or furnish in both byte or word form. Consequently, such prior art arrays handled data furnished in word form as two separate bytes, taking the time necessary to deal with the bytes independently. Recently, flash EEPROM memory arrays have been enlarged and are now able to handle data furnished in sixteen bit (word) increments. In providing circuitry to allow reading and writing to occur on both byte and word basis, it has been discovered that the electrically-isolation arrangements which protected flash EEPROM memory arrays storing only eight bits of data do not sufficiently protect flash EEPROM memory arrays storing sixteen bits which are also able to read and write data in eight bit groups.

SUMMARY OF THE INVENTION

It is, therefore, an object of the present invention to provide improved flash EEPROM memory arrays.

It is another more specific object of the present invention to provide circuitry for electrically isolating flash EEPROM cells used in a memory array which is capable of reading and writing data in both eight and sixteen bit operations.

These and other objects of the present invention are realized in a flash EEPROM memory array, in which a plurality of floating gate field effect transistor memory devices are arranged in blocks which are independently erasable. The blocks are divided into sub-blocks for storing lower and upper bytes of words to be stored. Apparatus is provided for disabling the wordlines to all high byte sub-blocks when a low byte sub-block is to be programmed, for disabling the wordlines to all low byte sub-blocks when a high byte sub-block is to be programmed, for grounding the sources of all high byte sub-blocks when a low byte sub-block is to be programmed, and for grounding the sources of all low byte sub-blocks when a high byte sub-block is to be programmed. This arrangement allows the arrays to function with substantially lower disturb conditions than if using the prior art arrangements.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a diagram of a flash EEPROM memory cell which may be utilized in a memory array protected by the circuitry of the present invention.

FIG. 2 is a diagram illustrating arrangements for programming and erasing prior art flash EEPROM memory arrays.

FIG. 3 is a a diagram illustrating arrangements for programming and erasing flash EEPROM memory arrays in accordance with the present invention.

FIG. 4 is a circuit diagram illustrating logic arrangements which may be used to implement the present invention.

DETAILED DESCRIPTION OF THE INVENTION

Referring now to FIG. 1, there is shown a memory cell or transistor device 9 used with the present invention. The device 9 (an N channel floating gate MOS field effect transistor) is formed in a silicon substrate such as the P-type substrate 15. The device 9 includes a pair of spaced-apart regions disposed in the substrate 15, specifically a drain region 12 and a source region 13. A polysilicon floating gate 10 is generally disposed between these regions and insulated from these regions by a layer of silicon dioxide 14 (or other insulative layer). The floating gate 10 at the completion of the processing is completely surrounded by an oxide layer and, hence, floats electrically. A second control gate 11 is disposed above the floating gate 10; in the presently preferred embodiment, this gate 11 is fabricated from a second layer of polysilicon. The control gate 11 is typically a continuous polysilicon strip forming a word line in the integrated circuit arrays of the figures which follow.

The source and drain regions of the device 9 are both doped with an arsenic dopant and the source region is additionally doped with a phosphorous dopant. Hence, the source region is more deeply doped and, as shown, overlaps the overlying floating gate 10. The device 9 may be constructed using well-known CMOS technology. The N channel device illustrated may be fabricated directly in a P type substrate or when an N type substrate is used may be fabricated in a P type well formed in the substrate.

As currently employed, the memory devices are programmed by negatively charging the floating gate 10 by coupling the word line connected to the control gate 11 to a potential of approximately +12 volts, the drain region to approximately +7 volts, and the source region to ground. With these conditions, channel hot electron injection occurs through the oxide layer 14. To erase the cell, the drain region is floated, the wordline connected to the control gate 11 is grounded, and a potential of approximately +12 volts is applied to the source region. Under these conditions, charge is tunneled from the floating gate. A cell is read by applying a positive potential (less than that which would cause charge to transfer onto the floating gate) to the control gate 11, applying ground to the source region, and applying a potential of +1 volt to the drain region. Current through the device is sensed to determine if the floating gate is or is not negatively charged. As with other floating gate devices, the negative charge on the floating gate shifts the threshold voltage of the device making it less conductive. Thus, with a sense amplifier, the presence or absence of charge on the floating gate 10 can be determined.

FIG. 2 illustrates a portion of a memory array 20 comprised of the devices 9 illustrated in FIG. 1. The array 20 is divided into blocks of devices 9 in such a manner that all of the memory devices 9 of any one block may be erased together but independently of the memory devices 9 of the other blocks. The circuitry includes wordlines 21 referred to in FIG. 1 which connect to all of the control gate terminals of the devices 9 connected in a particular row across all of the blocks of the array. The circuitry also includes bitlines (only one of which is shown) which connect to the drain terminals of all of the devices in any column in any one block. Although not shown in the Figure, the bitlines can be connected to a source of voltage through a column select transistor positioned in each bitline in order to read the value stored in any device 9. The source terminals of all of the devices 9 are connected to ground in the normal operational state of the array.

Two blocks of the array, blocks zero and one, are illustrated although a large number of blocks would normally be included in an array. Each of these blocks includes memory devices 9 arranged in rows and columns to store data in groups of eight bits, a byte of data. The array is provided with circuitry connected for programming, reading, and erasing the memory devices. In each block, the source terminals of all of the devices 9 are connected together so that an erasing voltage of +12 volts may be applied to the source terminals of all of the devices 9 simultaneously. By grounding all of the wordlines and floating all of the drain terminals while the erasing voltage is applied to all of the source terminals, all of the devices of a block may be erased together. The voltage differential between the gate and source terminals of +12 volts is sufficient to remove the charge from the floating gate and place all of the devices of a block of the array in the erased condition.

In order to program a byte of block zero in the typical manner without disturb protection, a voltage of twelve volts is applied to the selected wordline and hence to the control gate terminals of the selected byte of block zero. Since a wordline is shared across both of the blocks (and all other blocks of the array), the gates of the cells on the selected wordline of block one also receive twelve volts. The non-selected wordlines are placed at ground. The drain of the devices 9 selected to be programmed in block zero are placed at seven volts. The drains of the devices on the wordline in block one are floated, and the sources of all of the devices 9 are grounded. Thus, the gate-to-source voltage across the selected transistors in block zero is twelve volts which, with the drain voltage of seven volts, programs the selected devices. However, the gate-to-source voltage across the devices of block one on the selected wordlines is also twelve volts. Although this voltage does not program the devices of block zero because the drains of those devices are floated, this voltage does stress the silicon layer 14 of the devices on the selected wordline and causes some change in the charge stored. This stress is called a gate disturb condition.

In order to reduce the effect of the stress just described, prior art arrays have provided arrangements which place +2.5 volts on the source terminals of the devices of a block which is not being programmed when the programming of another block is occurring. This reduces the gate-to-source voltage of the devices of block one to less than ten volts and reduces the stress caused by the gate disturb condition. This helps the devices to maintain their conditions better.

However, a second stress condition occurs due to the voltage placed to reduce the gate disturb condition on the source terminals of the memory devices of a non-selected block. The devices on non-selected wordlines of block one have control gates which are grounded and drain terminals which are floated during the programming of block zero. The +2.5 volts placed on the source terminals of these devices to reduce the gate disturb condition creates a source-to-gate voltage of +2.5 volts. This voltage stresses the devices so affected by applying a voltage of the polarity necessary to erase the devices. Although an erase will not occur, the devices will again be stressed; and some slow leakage of charge from the floating gate will occur. This is called a source disturb condition. This condition has not been corrected in prior art flash memory arrays which manipulate eight bits of data at one time.

FIG. 3 illustrates a portion of a flash EEPROM memory array designed to store data in increments of bytes and words. The preferred embodiment of the array is divided into a number of planes of memory devices 9. The planes are grouped in pairs. Each plane includes a number of sub-blocks of memory devices. Each of the sub-blocks on one plane of a pair of planes stores the low order bits of a word while each of the sub-blocks on the other plane of the pair stores the high order bits of a word. Each of the sub-blocks from each plane of a pair of planes is associated with one of the sub-blocks from the other plane of the pair to form a block the memory devices of which are independently erasable from those of other blocks.

Two sub-blocks zero and one of two array planes zero and one are illustrated. Each of the blocks zero and one stores eight bits of data. Sub-block zero stores the bits 0–7, the lower byte of a word; and sub-block one stores the bits 8–15, the upper byte of the word. The two sub-blocks are used together to store data in word format and together form a block which is independently erasable; similar pairs of sub-blocks on array planes zero and one form other independently erasable blocks.

In order to write data in sixteen bit (word) format, the selected wordlines of each sub-block on both of the array planes are connected to the same wordline voltage, typically +12 volts. Then, the appropriate bitlines are selected to program the desired devices; and a voltage of +7 volts is applied to the drains of the selected devices. The source voltage of all devices on the selected block (comprised of the two sub-blocks zero and one) is held at ground.

The application of these voltages allows the selected memory devices in the particular word of the selected block to be programmed. Simultaneously, the source terminals of all of the devices on all other blocks of the array are placed at a positive +2.5 volts. As will be understood from the description of the eight bit blocks of the prior art arrays, this has the desired effect of reducing the gate disturb condition when the array is being programmed in a sixteen bit (word) mode.

However, as was explained above, the array must also be programmed in byte modes. That is, various software procedures will store information as individual eight bit values in the positions of both the lower and the upper bytes of a word. This requires that programming voltages be applied to the sub-blocks to program cells in only one sub-block at a time. The arrangement provided by the prior art to protect against gate disturb conditions does not suffice in such a situation and, in fact, worsens the condition.

For example, to write data in byte format to the sub-block zero using the prior art disturb protection arrangement, the selected wordlines of both of the array plane pair are connected to the same wordline voltage, typically +12 volts. Then, the appropriate bitlines of sub-block zero are selected to program the desired devices; and a voltage of +7 volts is applied to the drains of the selected devices in sub-block zero. The source voltage of both sub-blocks of the selected block is held at ground. This allows the selected devices of the particular byte of the sub-block zero to be programmed.

Simultaneously, the devices of sub-block one have their drains floated. Consequently, the devices of sub-block one have +12 volts at the selected wordline and ground applied to their source terminals. Although a +2.5 volt potential may be applied to the sources of all blocks other than the block which is being programmed, the sub-block one has the source terminals of its memory devices connected to the source terminals of the devices on sub-block zero which are held at ground. Thus, while the gate disturb problem is reduced for all blocks other than the block being programmed, the devices of sub-block one connected to the selected wordline are subject to the full gate disturb potential.

Moreover, whenever the array is being programmed in an eight bit (byte) mode, the devices on the selected wordline which are not being programmed are subjected to the gate disturb condition (at the reduced level) both when the lower byte is programmed and when the higher byte is programmed. Thus, these devices are subject to twice as much stress as are devices in the prior art eight bit arrays. In addition, the devices subject to source disturb on other blocks of the array will similarly be subject to source disturb twice as often in the eight bit mode as when programming in the sixteen bit mode. This makes the source disturb problem significant.

The present invention eliminates this duplication of the gate disturb condition for devices of all blocks which are in the deselected array plane and eliminates the duplication of the source disturb condition for blocks of the array which are not being programmed. This result is accomplished by providing means for disabling the wordlines of all high byte sub-blocks when a low byte sub-block is being programmed and for disabling the wordlines of all low byte sub-blocks when a high byte sub-block is being programmed. By disabling the wordlines to all of the high byte sub-blocks whenever the low byte is programmed, the devices of these blocks are not subject to gate disturb whatsoever when any low byte is programmed. A similar result occurs for the low byte when the high byte is programmed. This is true not only of the block being programmed, but for all other blocks as well.

Moreover, when programming a low byte sub-block, the source terminals of all high byte sub-blocks are placed at ground while the source terminals of all remaining low byte sub-blocks other than that being programmed are placed at +2.5 volts. This eliminates any source disturb condition for any high byte sub-block during the programming of any low byte sub-block while reducing the gate disturb condition of the low byte blocks during low byte programming in the manner of the prior art.

The arrangement functions in a similar manner to reduce the effect of gate and source disturb conditions when the high byte of a block is being programmed. In such case, the low byte word lines are cut off, the source terminals of the low byte sub-blocks are placed at ground potential, while the source terminals of all remaining high byte sub-blocks other than that being programmed are placed at +2.5 volts.

Thus the invention reduces the disturb conditions to be expected to half that which would occur using the arrangements of the prior art in the sixteen bit arrays thereby equalizing the disturb conditions seen in sixteen bit arrays to those of the eight bit arrays.

In order to accomplish the foregoing, the circuitry of FIG. 4 is utilized. The control circuitry utilized with the flash EEPROM memory array including the present invention receives a pair of signals from the host with which it is associated. These signals define the modes of operation. When the first of these signals called BYTE# is high, the array is functioning in a sixteen bit mode of operation. When the BYTE# signal is low, the array is functioning in one of the eight bit modes of operation. When the BYTE# signal is low, the second signal called AM1 controls which byte mode the array is in. If AM1 is low, operation is in the low byte mode; if AM1 is high, operation is in the high byte mode.

Consequently, a logic circuit 41 which receives the values of the signals BYTE# and AM1 and a signal indicating that the system is in the programming mode may provide outputs to control the voltages applied to the wordlines and source terminals of the array. As will be understood, circuitry to accomplish the foregoing requires essentially gating circuitry to perform a Boolean AND operation of the three input signals and generate a signal to turn off the low byte sub-blocks and a signal to turn off the high byte sub-blocks.

The LowByteOff and HighByteOff output signals from the logic circuit 41 are utilized to cause the wordline decode circuitry of the array to turn off the wordlines of the high or low bytes and source decode circuitry of the array to disconnect the source terminals from +2.5 volts and connect them instead to ground. The array of the present invention has separate decoding circuitry for each of the wordlines, the bitlines, and the source terminals of the low and the high byte array planes. Each of the decode circuits for any array plane decodes the same address. The LowByteOff and HighByteOff signals are transferred to low and high byte wordline decode circuits 43 and 44 to control the voltages applied to the wordlines and to low and high byte source decode circuits 46 and 47 to control the voltages applied to the source terminals of the array. The pair of source decode low and high circuits 46 and 47 receive the Y addresses to decode the sub-blocks selected and not selected. The source decode low and high circuits 46 and 47 provide control signals to cause sets of source switches 54 to provide an erase voltage of +12 volts, a gate disturb inhibit voltage of +2.5 volts, or a programming voltage of ground to the source terminals of the memory devices in the selected block. The array is also provided with low and high byte Y decoders 49 and 50 which receive the Y addresses to control the selection of bitlines and couple the condition of the memory devices to a sense amplifier 52; the sense amplifier 52 provides eight or sixteen bit output signals depending on the condition of a read operation.

The signals provided by the logic circuit 41 to indicate whether the low byte wordlines or the high byte wordlines are to be turned off are transferred to the wordline decode low and high circuits 43 and 44, respectively. The signals cause the wordline decode low circuit 43 to turn off the selected low byte wordline when the high byte only is being programmed and cause the wordline decode high circuit 44 to turn off the selected high byte wordline when the low byte only is being programmed. Similarly, the signals provided by the logic circuit 41 to indicate whether the low byte wordlines or the high byte wordlines are to be turned off are transferred to the source decode low and high byte circuits 46 and 47. These signals cause ground to be applied by the source switches 54 to the source terminals of all memory devices in all high byte sub-blocks and +2.5 volts to be applied by the source switches 54 to the source terminals of all memory devices in all low byte sub-blocks (other the sub-block being programmed) when only a low byte is being programmed. These signals also cause ground to be applied by the source switches 54 to the source terminals of all memory devices in all low byte sub-blocks and +2.5 volts to be applied by the source switches 54 to the source terminals of all memory devices in all high byte sub-blocks (other the sub-block being programmed) when only a high byte is being programmed.

If the array is in programming mode and the signal BYTE# is high, the normal voltages are applied to the array to reduce the disturb problem in a sixteen bit mode since the logic circuit 41 produces no signals to vary the normal addressing. Thus, the wordline decode low and high circuits 43 and 44 each receive the same X address and cause the wordline selected to receive +12 volts. This +12 volt is transferred to all of the low and high sub-blocks of the array. The wordline decode low and high circuits 43 and 44 cause the non-selected wordlines to be grounded. The Y decoder low and high circuits 49 and 50 cause the drains of the selected block to receive +7 volts and the of non-selected blocks to float. The source decode low and high circuits 46 and 47 cause the sets of source switches 54 to ground the source terminals of the memory devices in the selected block. In addition, the source decode low and high circuits 46 and 47 cause the sets of source switches 54 to connect the source terminals of all sub-blocks other than those being programmed to receive +2.5 volts. Thus, in the sixteen bit mode of programming, the gate disturb condition of all sub-blocks other than the two in the block being programmed is reduced in the conventional manner.

If the array is in programming mode and the signal BYTE# is low, then a low value for the signal AM1 generates a HighByteOff signal which turns off the wordlines of all of the high byte sub-blocks, grounds the source terminals of all high byte sub-blocks, and places the source terminals of all low byte sub-blocks other than that being programmed at +2.5 volts. If the array is in programming mode and the signal BYTE# is low, then a high value for the signal AM1 generates a LowByteOff signal which turns off the wordlines of all of the low byte sub-blocks, grounds the source terminals of all low byte sub-blocks, and places the source terminals of all high byte sub-blocks other than that being programmed at +2.5 volts.

Thus, the present invention is adapted to protect against both gate and source disturb conditions and to reduce the effect of those conditions when a sixteen bit flash array is programmed in eight bit modes.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In a flash EEPROM memory array in which a plurality of floating gate field effect transistor memory devices having source, drain, and control gate terminals are arranged in rows and columns, in which wordlines are utilized to select the rows of such devices and bitlines are utilized to select the columns of such devices, in which groups of such devices are arranged in blocks which are independently erasable, and the blocks are divided into sub-blocks for storing lower and upper bytes of words to be stored, the improvement comprising:
    means for disabling the wordlines to all high byte sub-blocks when a byte of data is to be written to a low byte sub-block, and
    means for disabling the wordlines to all low byte sub-blocks when a byte of data is to be written to a high byte sub-block.

2. In a flash EEPROM memory array as claimed in claim 1, the improvement further comprising:
    means for grounding the sources terminals of the devices of all high byte sub-blocks when a byte of data is to be written to a low byte sub-block, and
    means for grounding the sources terminals of the devices of all low byte sub-blocks when a byte of data is to be written to a high byte sub-block.

3. A memory array comprising:
    a plurality of floating gate memory devices having each having drain, source, and gate terminals, the memory devices being arranged in logical rows and columns,
    the array being divided into a plurality of blocks each having a plurality of bitlines coupled to the drain terminals of the memory devices of the logical columns of the block, each of the blocks being divided into first and second sub-blocks;

a plurality of wordlines each connected to the gate terminals of the memory devices of a logical row of such devices in all of either the first or the second the sub-blocks;

means for selectively placing a programming potential either on a wordline connected to the gate terminals of the memory devices of a particular row of all of one of the first or the second sub-blocks while placing a non-programming potential on a wordline connected to the gate terminals of the memory devices of the particular row of all other sub-blocks, or on wordlines connected to the gate terminals of the memory devices of a particular row of all of both sub-blocks;

means for selectively placing a programming potential on a selected number of bitlines of either a particular sub-block receiving a programming potential on a wordline or a particular block receiving a programming potential on wordlines connected to the gate terminals of particular logical rows while maintaining other bitlines at a non-programming potential;

and means for selectively placing the source terminals of the memory devices of either the particular sub-block or the particular block at a programming potential.

4. A memory array as claimed in claim 3 further comprising:

means for placing the source terminals of all memory devices in a sub-block not being programmed but which is receiving a programming potential on a wordline at a disturb potential, and means for placing the source terminals of all memory devices in a sub-block not being programmed but which is not receiving a programming potential on a wordline at a non-programming potential.

5. A memory array as claimed in claim 3 in which the means for selectively placing a programming potential either on a wordline connected to the gate terminals of the memory devices of a particular row of all of one of the first or the second sub-blocks while placing a non-programming potential on a wordline connected to the gate terminals of the memory devices of the particular row of all other sub-blocks, or on wordlines connected to the gate terminals of the memory devices of a particular row of all of both sub-blocks comprises:

a first wordline decoder coupled to the wordlines of all of the first sub-blocks, a second wordline decoder coupled to the wordlines of all of the second sub-blocks, and means for causing the first and second decoders to place the programming potentials and the non-programming potentials on selected wordlines.

6. A memory array as claimed in claim 5 in which the means for causing the first and second decoders to place the programming potentials and the non-programming potentials on selected wordlines comprises a logic circuit receiving signals indicating whether a block or a sub-block is to be programmed, and whether a sub-block to be programmed is a first or a second sub-block.

7. A memory array as claimed in claim 4 in which the means for placing the source terminals of all memory devices in a sub-block not being programmed but which is receiving a programming potential on a wordline at a disturb potential, and the means for placing the source terminals of all memory devices in a sub-block not being programmed but which is not receiving a programming potential on a wordline at a non-programming potential comprises:

a first source switch coupled to the source terminals of the memory devices of all of the first sub-block, a second source switch coupled to the source terminals of the memory devices of all of the second sub-block, and means for causing the first and second source switches to place the disturb potentials and the non-programming potentials on selected source terminals.

8. A memory array as claimed in claim 7 in which the means for causing the first and second source switches to place the disturb potentials and the non-programming potentials on selected wordlines comprises a logic circuit receiving signals indicating whether a block or a sub-block is to be programmed, and whether a sub-block to be programmed is a first or a second sub-block.

9. A memory array as claimed in claim 4 in which the means for selectively placing a programming potential either on a wordline connected to the gate terminals of the memory devices of a particular row of all of one of the first or the second sub-blocks while placing a non-programming potential on a wordline connected to the gate terminals of the memory devices of the particular row of all other sub-blocks, or on wordlines connected to the gate terminals of the memory devices of a particular row of all of both sub-blocks comprises:

a first wordline decoder coupled to the wordlines of all of the first sub-blocks, and a second wordline decoder coupled to the wordlines of all of the second sub-blocks;

the means for placing the source terminals of all memory devices in a sub-block not being programmed but which is receiving a programming potential on a wordline at a disturb potential, and the means for placing the source terminals of all memory devices in a sub-block not being programmed but which is not receiving a programming potential on a wordline at a non-programming potential comprises:

a first source switch coupled to the source terminals of the memory devices of all of the first sub-block, and a second source switch coupled to the source terminals of the memory devices of all of the second sub-block; and further comprising a logic circuit receiving signals indicating whether a block or a sub-block is to be programmed, and whether a sub-block to be programmed is a first or a second sub-block for providing signals to operate the first and second wordline decoders and the first and second source switches.

* * * * *